US012609658B2

(12) United States Patent
Chen

(10) Patent No.: US 12,609,658 B2
(45) Date of Patent: Apr. 21, 2026

(54) PRE-COMPENSATION METHOD AND PRE-COMPENSATION CIRCUIT THEREOF

(71) Applicant: Wistron Corporation, New Taipei City (TW)

(72) Inventor: Chih-Ming Chen, New Taipei City (TW)

(73) Assignee: Wistron Corporation, New Taipei City (TW)

( * ) Notice: Subject to any disclaimer, the term of this patent is extended or adjusted under 35 U.S.C. 154(b) by 549 days.

(21) Appl. No.: 18/116,238

(22) Filed: Mar. 1, 2023

(65) Prior Publication Data

US 2024/0195363 A1 Jun. 13, 2024

(30) Foreign Application Priority Data

Dec. 7, 2022 (TW) .................................. 111147015

(51) Int. Cl.
H03F 1/32 (2006.01)

(52) U.S. Cl.
CPC ......... H03F 1/3247 (2013.01); H03F 1/3258 (2013.01)

(58) Field of Classification Search
None
See application file for complete search history.

(56) References Cited

U.S. PATENT DOCUMENTS

| | | | |
|---|---|---|---|
| 2013/0142284 A1 | 6/2013 | Asensio | |
| 2013/0166259 A1 | 6/2013 | Weber | |
| 2014/0266431 A1 | 9/2014 | Chen | |
| 2022/0200539 A1 | 6/2022 | Benosman | |

FOREIGN PATENT DOCUMENTS

CN 114297922 A 4/2022

*Primary Examiner* — Andrea Lindgren Baltzell
*Assistant Examiner* — Malane Lieng
(74) *Attorney, Agent, or Firm* — Winston Hsu

(57) ABSTRACT

A pre-compensation method for a pre-compensation circuit coupled to a power amplifier to compensate for nonlinearity of the power amplifier includes performing pre-distortion according to at least one parameter or at least one hyperparameter to convert a first input signal received by the pre-compensation circuit into a first pre-distortion output signal, updating the at least one parameter or the at least one hyperparameter according to Bayesian Optimization, Causal Bayesian Optimization, or Dynamic Causal Bayesian Optimization, and performing pre-distortion according to the at least one parameter updated or the at least one hyperparameter updated to convert a second input signal received by the pre-compensation circuit into a second pre-distortion output signal.

19 Claims, 10 Drawing Sheets

(a)

(b)

(c)

(d)

PRE-COMPENSATION METHOD AND PRE-COMPENSATION CIRCUIT THEREOF

BACKGROUND OF THE INVENTION

1. Field of the Invention

The present invention relates to a pre-compensation method and a pre-compensation circuit thereof, and more particularly, to a pre-compensation method and a pre-compensation circuit, which reduce computational complexity or improve accuracy or efficiency.

2. Description of the Prior Art

Power amplifiers are inherently non-linear. The nonlinearity degrades the bit-error rate (BER) and data throughput. To reduce the nonlinearity, a power amplifier (PA) is run at lower power, which results in low efficiencies.

On the other hand, digital pre-distortion (DPD) is one of the most cost-effective linearization techniques. A digital pre-distorter (or its algorithm) needs to analyze or model the PA behavior accurately for successful deployment of the digital pre-distorter. As the signal bandwidth gets wider, a PA that has more complex frequency, electrical, and thermal behaviors tends to exhibit memory effects. Therefore, more advanced DPD algorithms are required. The most general algorithm for DPD implementation is Volterra series and its derivatives. However, the large number of coefficients of the Volterra series makes it unattractive for practical applications, because the large number of coefficients increases the computational burden and requires more input/output data for statistical confidence in the unknown coefficients. Therefore, there is still room for improvement when it comes to DPD.

SUMMARY OF THE INVENTION

It is therefore a primary objective of the present invention to provide a pre-compensation method and a pre-compensation circuit thereof to reduce computational complexity or improve accuracy or efficiency.

An embodiment of the present invention discloses a pre-compensation method, for a pre-compensation circuit coupled to a power amplifier, comprising performing pre-distortion according to at least one parameter or at least one hyperparameter to convert a first input signal received by the pre-compensation circuit into a first pre-distortion output signal; updating the at least one parameter or the at least one hyperparameter according to Bayesian Optimization, Causal Bayesian Optimization, or Dynamic Causal Bayesian Optimization; and performing pre-distortion according to the at least one parameter updated or the at least one hyperparameter updated to convert a second input signal received by the pre-compensation circuit into a second pre-distortion output signal.

An embodiment of the present invention discloses a pre-compensation circuit, coupled to a power amplifier, comprising a digital pre-distortion actuator, configured for performing pre-distortion according to at least one parameter or at least one hyperparameter to convert a first input signal received by the digital pre-distortion actuator into a first pre-distortion output signal; and a training module, configured for updating the at least one parameter or the at least one hyperparameter according to Bayesian Optimization, Causal Bayesian Optimization, or Dynamic Causal Bayesian Optimization, wherein the digital pre-distortion actuator performs pre-distortion according to the at least one parameter updated or the at least one hyperparameter updated to convert a second input signal received by the digital pre-distortion actuator into a second pre-distortion output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
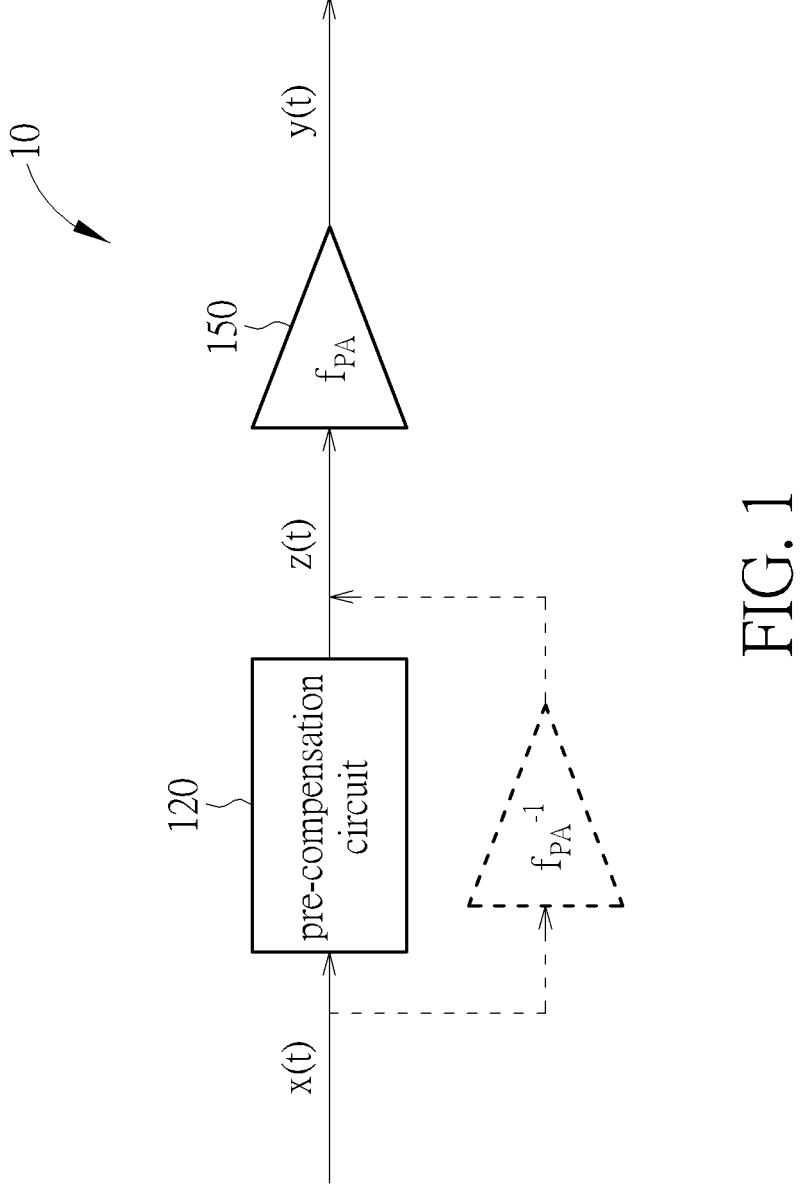
FIG. 1 is a schematic diagram of an amplification circuit according to an embodiment of the present invention.

FIG. 1 is a schematic diagram of an amplification circuit 10 according to an embodiment of the present invention. A pre-compensation circuit 120 of the amplification circuit 10 is able to adapt to variations in the nonlinearity of a power amplifier (PA) 150 of the amplification circuit 10, which changes with time, temperature, and different operating channels, and the pre-compensation circuit 120 may be regarded as or serve as a digital pre-distorter.

Digital pre-distortion (DPD) may correct for the nonlinearity of the PA 150 by modifying the complex waveform at the input before signal(s) enter a digital-to-analog converter (DAC). In another aspect, the nonlinearity of the PA 150 may correct the waveform of a pre-distortion output signal z(t) of the pre-compensation circuit 120, so the cascade/combination of the pre-compensation circuit 120 and the PA 150 may achieve linearization. As a result, an output signal y(t) of the PA 150 after the pre-compensation circuit 120 appears to come from a highly linear component, and an input signal x(t) may be amplified by a constant gain. As indicated by dotted lines in FIG. 1, the pre-compensation circuit 120 may be seen as an inverse of the PA 150. That is to say, the pre-compensation circuit 120 essentially inserts a nonlinear function (e.g., the inverse function of the PA 150)

between the input signal x(t) and the PA 150 to produce the (linear) output signal y(t). For example, a response function $f_{PA}$ of the PA 150 satisfies $y(t)=f_{PA}(z(t))$, and a response function $f_{DPD}$ of the pre-compensation circuit 120 satisfies $z(t)=f_{DPD}(x(t))$, where $f_{DPD}=f_{PA}^{-1}$.

Figure 2:
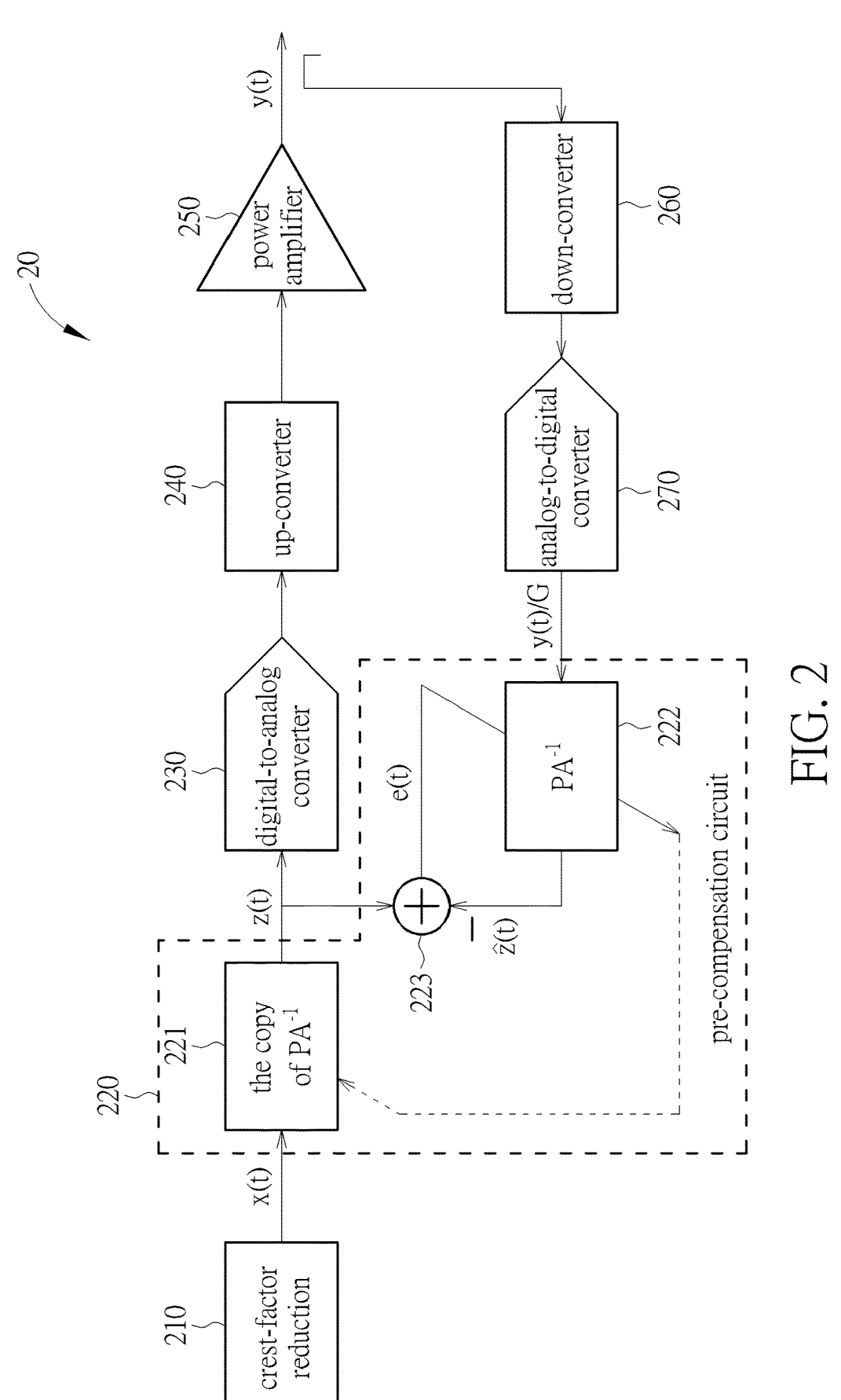
FIG. 2 is a schematic diagram of an indirect learning architecture for an amplification circuit 20 according to an embodiment of the present invention.

FIG. 2 is a schematic diagram of an indirect learning architecture for an amplification circuit 20 according to an embodiment of the present invention. The amplification circuit 20 may include a crest-factor reduction (CFR) 210 for reducing the peak-to-average power ratio (PAPR), a pre-compensation circuit 220, a DAC 230, an up-converter 240, a PA 250, a down-converter 260, and an analog-to-digital converter (ADC) 270.

DPD (function) may be defined algorithmically through software. In an indirect learning architecture, an algorithm may use two identical memory polynomial models for predistortion and training. For example, the pre-compensation circuit 220 may include a DPD actuator 221 and a training module 222. The DPD actuator 221 is configured to perform pre-distortion of the input signal x(t) in real time. The DPD actuator 221 performs the same/similar computation for each input signal x(t) at high speed, so it is suitable for the DPD actuator 221 to be implemented by Field Programmable Gate Array (FPGA), Application Specific Integrated Circuit (ASIC), or other circuits. The training module 222 updates parameters or hyperparameters of the DPD actuator 221 based on observations of the output signal y(t) of the PA 250 (as indicated by dotted lines in FIG. 2). The training module 222 involves relatively complicated computations, so it is suitable for the training module 222 to be implemented by a digital signal processor (DSP) or other circuits.

Using an indirect learning architecture to train the pre-compensation circuit 220 enables the pre-compensation circuit 220 to be constructed directly (i.e., to find/determine parameters or hyperparameters of the DPD actuator 221) according to the input signal x(t) and the output signal y(t) of the PA 250. The feedback path of the training module 222 may take y(t)/G as its input and $\hat{z}(t)$ as its output, where G controls the gain of the PA 250 after linearization. The DPD actuator 221 may be regarded as a copy of the feedback path (i.e., a copy of the training module 222), which may take the input signal x(t) as its input and the pre-distortion output signal z(t) as its output. The ideal is to make $y(t)=G \times x(t)$, which renders $z(t)=\hat{z}(t)$ and makes an error signal e(t) between the pre-distortion output signal z(t) and the output $\hat{z}(t)$ satisfy e(t)=0. The algorithm converges when the error signal e(t), which is equal to the difference between the pre-distortion output signal z(t) and the output $\hat{z}(t)$, or the square of the error signal e(t) (i.e., $\|e(t)\|^2$) is minimized.

Due to memory effect, the PA 250 becomes a nonlinear system with memory. That is, the output signal y(t) (currently/instantaneously) inputted by the PA 250 not only depends on the current input, but also is a function of the previous/past input value. For example, it satisfies $y(t)=f_{PA}(z(\tau))$, where $\tau \in (-\infty, t)$.

Figure 3:
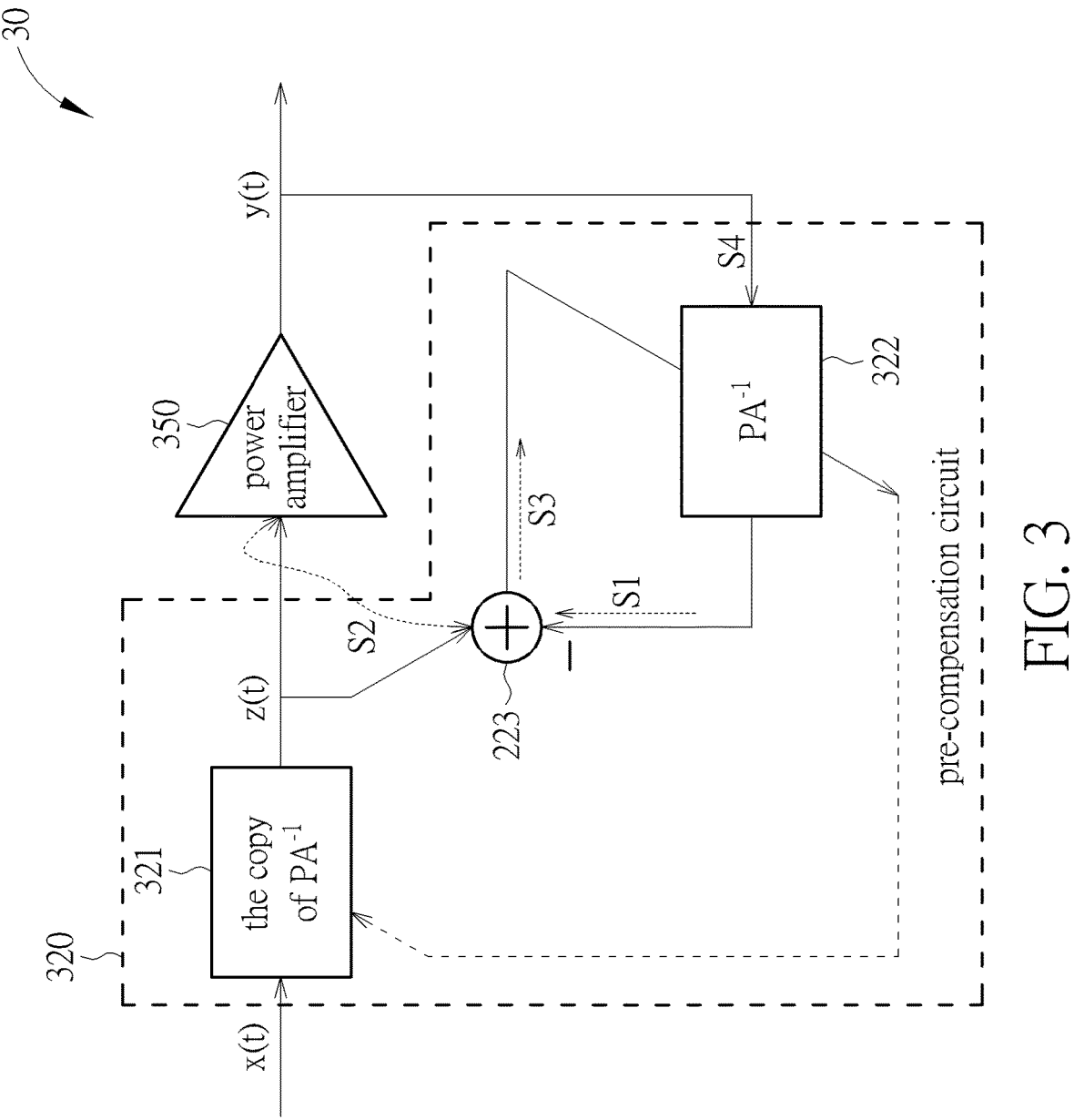
FIG. 3 is a schematic diagram of a recurrent indirect learning architecture for an amplification circuit according to an embodiment of the present invention.

Regarding the memory effect, FIG. 3 is a schematic diagram of a recurrent indirect learning architecture for an amplification circuit 30 according to an embodiment of the present invention. The structure of the amplification circuit 30 is basically similar to that of the amplification circuit 20 (although the CFR 210, the DAC 230, the up-converter 240, the down-converter 260, and the ADC 270 are not shown). The difference mainly lies in signal transmission.

Specifically, the input signal x(t) received by a DPD actuator 321 of a pre-compensation circuit 320 of the amplification circuit 30 is pre-distorted by the DPD actuator

321 using parameters and hyperparameters of the DPD actuator 321 to thereby output the pre-distortion output signal z(t). The pre-distortion output signal z(t) is amplified by a PA 350 of the amplification circuit 30 to provide the output signal y(t) at the output of the PA 350. A training module 322 of the pre-compensation circuit 320 computes/trains parameters and hyperparameters, such that the pre-distortion introduced by the DPD actuator 321 may compensate for the nonlinearity of the PA 350 (i.e., the pre-distortion is an inverse of the distortion resulting from the nonlinearity of the PA 350). The training module 322 may receive a (digital) signal S4, which represents the output signal y(t) from the output of the PA 350. According to the difference between a signal S1 output by the training module 322 and a signal S2, the combiner 223 (which may be a subtraction unit/circuit) of the pre-compensation circuit 320 outputs an error signal S3. The training module 322 observes the error signal S3 and adaptively configures the parameters and the hyperparameters to minimize a loss function or the error signal S3 (e.g., to make the error signal S3 zero). The loss function may be a function of the output $\hat{y}(t)$ (e.g., an estimated value) of the model or a function of a label (e.g., an expected value) corresponding to the output $\hat{y}(t)$. For example, the loss function may be equal to the difference between the output $\hat{y}(t)$ and the label. The label may be is a function of the input signal x(t).

In one embodiment, the signal S1 of the training module 322 may, for example, be divided into the output $\hat{z}(t)$ (as shown by a solid line in FIG. 3) corresponding to the output signal y(t) and an output $\hat{y}(t-1)$ (as shown by a dotted line in FIG. 3) corresponding to an output signal y(t-1). The signal S2 may, for example, be divided into the pre-distortion output signal z(t) (as shown by another solid line in FIG. 3) and the output signal y(t-1) (as shown by another dotted line in FIG. 3). The combiner 223 may output the error signal e(t) of the error signal S3 (as shown by still another solid line in FIG. 3), which satisfies $e(t)=z(t)-\hat{z}(t)$, in response to the signals z(t) and z(t) and output a signal e(t-1) of the error signal S3 (as shown by the still another dotted line in FIG. 3), which satisfies $e(t-1)=y(t-1)-\hat{y}(t-1)$, in response to the signals $\hat{y}(t-1)$ and y(t-1). In other words, in respect of memory effects, the recurrent indirect learning architecture in the embodiment of the present invention takes two kinds of signals of the error signal S3 (or more kinds of error signals) into account and minimize the loss function. Accordingly, the embodiment of the present invention not only considers the pre-distortion output signal z(t) of the DPD actuator 321 for the PA 350, but also considers at least one of previous pre-distortion output signals z(t-1) to z(t-k) of the DPD actuator 321 for the PA 350, where k is a positive integer. The PA 350 operates according to not only the pre-distortion output signal z(t) but also at least one of previous output signals y(t-1) to y(t-k) output from the PA 350 previously.

In another embodiment, the signal S1 of the training module 322 may be, for example, $\hat{z}(t)+\hat{y}(t-1)/G$, $\hat{z}(t)+\hat{z}(t-1)$, or $a_0 \times \hat{z}(t)+a_1 \times \hat{z}(t-1)+a_2 \times \hat{z}(t-2) \ldots +a_k \times \hat{z}(t-k)$, where coefficients $a_0$ to $a_k$ are real numbers. In other words, the signal S1 is not only related to the current output signal y(t) of the PA 350, but also related to previous output signals y(t-1), y(t-2), . . . , or y(t-k) output from the PA 350 in the past. The signal S2 may be, for example, $z(t)+y(t-1)/G$, $z(t)+z(t-1)$, or $a_0 \times z(t)+a_1 \times z(t-1)+a_2 \times z(t-2) \ldots +a_k \times z(t-k)$. In other words, the signal S2 is not only related to the current pre-distortion output signal z(t), but also related to previous pre-distortion output signal z(t-1), z(t-2), . . . , or z(t-k). The error signal S3 between the signals S1 and S2 may be, for example, $e(t)+e(t-1)$ or box $e(t)+b_1 \times e(t-1)+b_2 \times e(t-2) \ldots +b_k \times e(t-k)$, where coefficients $b_0$ to $b_k$ are real numbers. In other words, the signal S3 is not only related to the error signal $e(t)$, but also related to previous error signal $e(t-1)$, $e(t-2)$, ..., or $e(t-k)$. The parameters or hyperparameters of the response function $PA^{-1}$ of the DPD actuator 321 may be determined/obtained by minimizing the loss function. As a result, the pre-distortion output signal $z(t)$ that may reduce the final nonlinearity of the output signal $y(t)$ may be determined/obtained.

Figure 4:
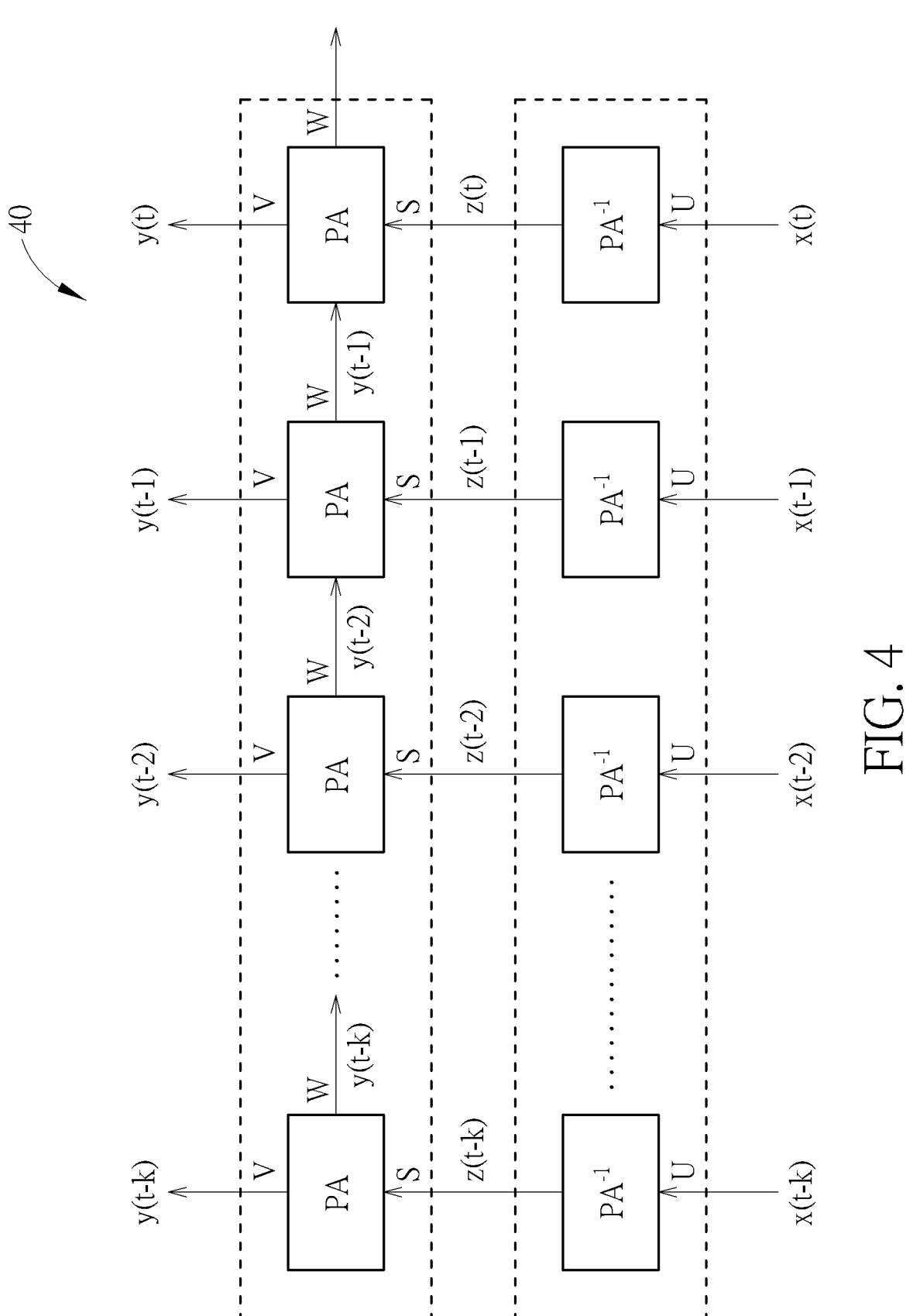
FIG. 4 is a schematic diagram of a recurrent DPD-PA cascade model according to an embodiment of the present invention.

As set forth above, the present invention may adopt a recurrent DPD-PA cascade model instead of a Volterra series model. For example, FIG. 4 is a schematic diagram of a recurrent DPD-PA cascade model 40 according to an embodiment of the present invention. The recurrent DPD-PA cascade model 40 may be used in the amplification circuit 30. As shown in FIG. 4, similar to recurrent neural network (RNN), the recurrent DPD-PA cascade model 40 may include weights V, W, S, and U, such that the response function PA (referred to as a first response function PA) on the rightmost side of FIG. 4 receives the output signal $y(t-1)$ of the response function PA on the left side (of the former/first response function PA) multiplied by the corresponding weight W and the pre-distortion output signal $z(t)$ of the response function $PA^{-1}$ below (the former/first response function PA) multiplied by the corresponding weight S. Similar to RNN, the cascade of the DPD actuator 321 and the PA 350 allows previous output(s) to be used as input(s), so decisions may be made based on current input(s) alongside learned from previous output(s). The response function $PA^{-1}$ of the DPD actuator 321 may be a copy of the inverse of the response function PA of the PA 350. The response function $PA^{-1}$ of the DPD actuator 321 may be updated in real time by a copy of the inverse of the response function PA of the PA 350 as opposed to at intervals.

Before the training of the recurrent DPD-PA cascade model 40 starts, the CFR 210 may be turned off. Otherwise the CFR 210 may affect the training of the recurrent DPD-PA cascade model 40. That is, the training of the pre-compensation circuit 220 occurs when samples of the PA 250 are collected with the CFR 210 disabled, such that all characteristics of the PA 250 may be obtained to train the pre-compensation circuit 220.

In the training (stage) of the recurrent DPD-PA cascade model 40, firstly, the pre-distortion output signal $z(t)$ and the output signal $y(t)$ corresponding to sample(s) of the input signal $x(t)$ are generated according to an (initial) response function $PA^{-1}$ of the training module 322 and the DPD actuator 321. The pre-distortion output signal $z(t)$ and the output signal $y(t)$ may be used for incremental learning on the training module 322 so as to update the training module 322 (i.e., the response function $PA^{-1}$ in FIG. 4 is replaced by another response function $PA^{-1}$ after incremental learning). The present invention determines/assesses how the input signal $x(t)$ is converted into the output signal $y(t)$ with the recurrent DPD-PA cascade model 40 in FIG. 4, and then copies the response function $PA^{-1}$ of the training module 322 onto the response function $PA^{-1}$ of the DPD actuator 321. After iterations, a (final) response function $PA^{-1}$ (i.e., the response function $PA^{-1}$ in the bottom right-hand corner of FIG. 4) may be determined so as to convert the input signal $x(t)$ into the output signal $y(t)$ optimally. In other words, as shown in FIG. 4, samples of the signals x, z, y may be used to train the recurrent DPD-PA cascade model 40, and therefore parameters or hyperparameters of a model for the response function $PA^{-1}$ (i.e., an inverse function $f_{PA}^{-1}$) are calculated to update the pre-compensation circuit 320.

After the pre-compensation circuit 320 is updated by the parameters or hyperparameters of the model for the response function $PA^{-1}$ trained for time instants t to t-k, the training (stage) is completed, and the CFR 210 may be turned on to test the recurrent DPD-PA cascade model 40.

More specifically, in the training (stage), the recurrent DPD-PA cascade model 40 may use Dynamic Causal Bayesian Optimization (or Bayesian Optimization, Causal Bayesian Optimization) to optimize parameters/hyperparameters of the recurrent DPD-PA cascade model 40 instead of using backward propagation to train the recurrent DPD-PA cascade model 40 so as to reduce computational complexity.

Take Bayesian Optimization as an example. Bayesian Optimization is a black-box optimization algorithm for solving extremum problems of functions whose expressions are unknown. For example, $L(P_1, P_2, \ldots, P_m, HP_1, HP_2, \ldots, HP_n)=uef( ) P_1, P_2, \ldots, P_m, HP_1, HP_2, \ldots, HP_n)$, where L( ) may represent the loss function of a model (which may serve as an objective function), uef( ) may represent a function whose expression is unknown, $P_1$ to $P_m$ may represent parameters of the model, and $HP_1$ to $HP_n$ may represent hyperparameters of the model, and m and n are positive integers. In other words, the expression of the relationship function uef( ) among the loss function, the parameter(s) and the hyperparameter(s) of the model is unknown. The parameter(s) and the hyperparameter(s) at arbitrary time to minimize/maximize the loss function L( ) may be calculated by using Bayesian Optimization. In this way, the pre-compensation circuit 320 may be updated to combine the nonlinearity of the pre-compensation circuit 320 and the PA 350 into one linear result (i.e., to compensate for nonlinearity).

Figure 5:
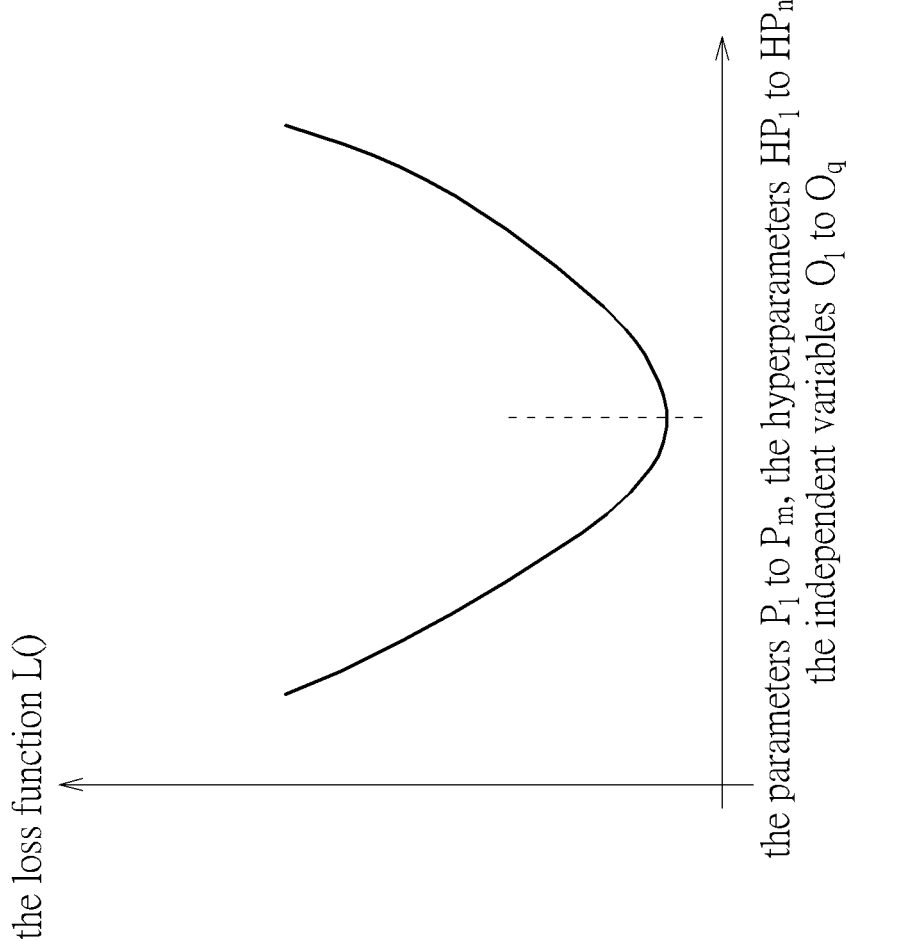
FIG. 5 is a schematic diagram of the relationship between the loss function, the parameters, and the hyperparameters according to an embodiment of the present invention.

For example, FIG. 5 is a schematic diagram of the relationship between the loss function L( ), the parameters $P_1$ to $P_m$, and the hyperparameters $HP_1$ to $HP_n$ according to an embodiment of the present invention. However, FIG. 5 is only for illustration to specify that there are relationships among the loss function L( ), the parameters $P_1$ to $P_m$, and the hyperparameters $HP_1$ to $HP_n$, while the expression of the relationship function uef( ) among the loss function L( ), the parameters $P_1$ to $P_m$, and the hyperparameters $HP_1$ to $HP_n$ is unknown in most cases. Coordinates of one single point on the horizontal axis of FIG. 5 may correspond to a point in the multi-dimensional space formed/constituted by the parameters $P_1$ to $P_m$ and the hyperparameters $HP_1$ to $HP_n$.

Figure 6:
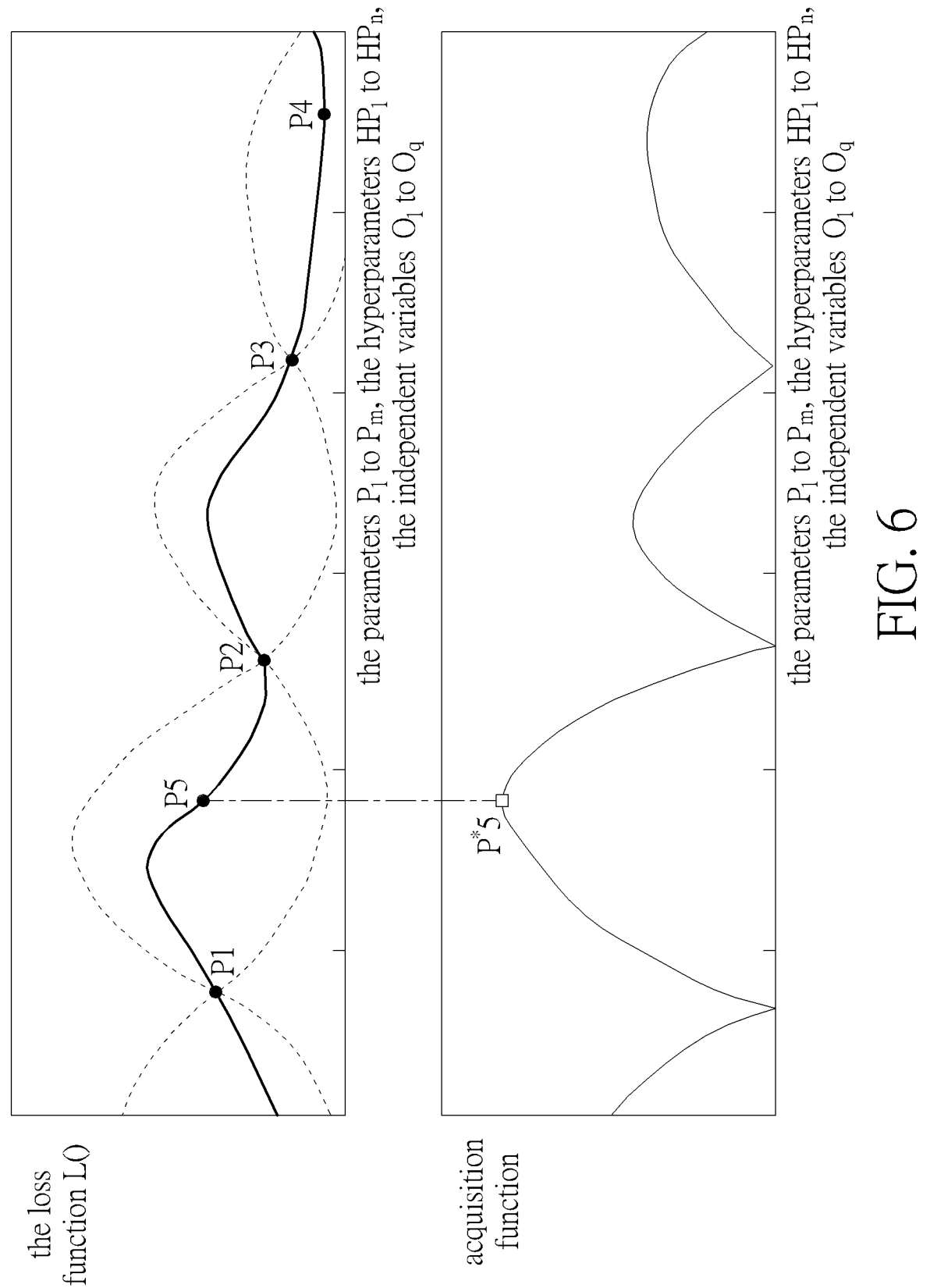
FIG. 6 is a schematic diagram of Bayesian Optimization for a one-dimensional problem according to an embodiment of the present invention.

Since the expression of the relationship function uef( ) is unknown, Bayesian Optimization may roughly fit the relationship function uef( ) using partial/finite sampling points and leverage information of previous sampling point(s) to determine the next sampling point so as to find extremum point(s). For example, FIG. 6 is a schematic diagram of Bayesian Optimization for a one-dimensional problem according to an embodiment of the present invention, where the thick solid line represents estimated function values of the loss function L( ), and the solid black points P1 to P5 respectively represent sampling points which have been found, the area enclosed by two dotted lines represents the fluctuation range (centered on a mean value and proportional to a standard deviation) of the loss function L(at each point, and the thin solid line represents an acquisition function. The idea of Bayesian Optimization is to first generate an initial candidate solution set (e.g., the loss function L( ), the parameter(s), and the hyperparameter(s) corresponding to the solid black point $P_1$), then search for the next sampling point (e.g., the solid black point P2), which may have an extreme value, based on the initial candidate solution set, repeatedly search for the next sampling point (e.g., the solid black points P3-P5), which may have an extreme value, until the iteration terminates, and add all the searched sampling points (e.g., the solid black points P1-P5) to the candidate solution sets. Finally, a (global) extremum point is found from the sampling points of the candidate solution sets as the solution of the problem (e.g., the loss function L( ), the parameter(s), and the hyperparameter(s) corresponding to the solid black point P5), thereby find the parameters $P_1$ to $P_m$ and the hyperparameters $HP_1$ to $HP_n$ used to update the pre-compensation circuit 320.

Bayesian Optimization estimates mean value(s) and variance(s) of the true loss function based on the function values of the sampling points that have been found (e.g., the loss function corresponding to the solid black point P1) to determine the next sampling point (e.g., the solid black point P2) according to the sampling point already found (e.g., the solid black point P1). The estimated loss function (i.e., the mean value of the loss function at each point) represented by the thick solid line in FIG. 6 passes through the sampling points (e.g., the solid black points P1-P4), and the variance is minimized. The variance is larger when the estimated objective function is far from the sampling point (e.g., the solid black points P1-P4). The acquisition function represented by the thin solid line in FIG. 6 may be constructed according to mean values and variances; that is, the acquisition function may be a function of mean values and variances. The estimation of the possibility that a point (e.g., one of the solid black points P1-P5) is an extremum point of the loss function reflects the degree that the point is worth searching. A relative extremum point of the acquisition function may correspond to the next sampling point of the loss function: For example, the point P*5 represented by the rectangular box in FIG. 6 is the maximum point of the acquisition function and may correspond to the next sampling point (i.e., the solid black point P5) of the loss function (according to the parameters $P_1$ to $P_m$, and the hyperparameters $HP_1$ to $HP_n$ corresponding to the maximum point).

In one embodiment, the loss function L( ), the parameters $P_1$ to $P_m$, and the hyperparameters $HP_1$ to $HP_n$ corresponding to one of the solid black points $P_1$-P5 may be obtained from the input signals x(t) to x(t-k), the pre-distortion output signals z(t) to z(t-k), the output signals y(t) to y(t-k), the signals $\hat{z}(t)$ to $\hat{z}(t-k)$, $\hat{y}(t)$ to $\hat{y}(t-k)$, other signals, or other data internally stored, but is not limited thereto. In one embodiment, the signals $\hat{y}(t)$ to $\hat{y}(t-k)$ may be functions of the signals $\hat{z}(t)$ to $\hat{z}(t-k)$.

The algorithm of the present invention may use Gaussian process regression to predict the probability distribution of a function value of the loss function L(at any point based on the function values of the objective function at a set of sampling points. Gaussian process regression may extend to observations with independent normally distributed noise of known variance. The variance may be unknown, so it may assume that the noise is of common variance and that the noise includes the variance as a hyperparameter. The present invention uses the posterior mean of the Gaussian process that includes noise, which is a drift value rather than the noise of an SINR. In one embodiment, environmental factors such as temperature and humidity or the PA 350 itself may have an influence on the gain of the PA 350, causing a drift value of the loss function with respect to certain parameters and hyperparameters. In other words, the solid black point P5 may not select/correspond to the desired/expected extremum of the functional relationship uef( ), but may select/correspond to a relatively optimized extremum close to the desired/expected extremum of the functional relationship uef( ).

According to result(s) of Gaussian process regression, an acquisition function (which is used to measure the degree that each point of the loss function is worth exploring) may be constructed to solve a (relative) extremum of the acquisition function so as to determine the next sampling point of the loss function. The acquisition function may be, for example, knowledge gradient (KG), entropy search (ES), or predictive entropy search (PES). Afterwards, the extremum of the loss function of the set of sampling points (which have been found since the beginning) is returned as the extremum of the loss function (e.g., the minimum loss function in response to the optimal parameters and the optimal hyperparameters). The parameters $P_1$ to $P_m$ and the hyperparameters $HP_1$ to $HP_n$ to update the pre-compensation circuit 320 may thus be found.

In one embodiment, there may be many independent variables to be considered by the algorithm of the present invention (in addition to the parameters $P_1$ to $P_m$ and the hyperparameters $HP_1$ to $HP_n$). When the spatial dimension grows, the performance of Bayesian Optimization may deteriorate exponentially. Therefore, the algorithm of the present invention may extend to Causal Bayesian Optimization (CBO). In other words, the present invention may use Causal Bayesian Optimization to calculate the optimal/minimum loss function when the loss function L(is related to the parameters $P_1$ to $P_m$, the hyperparameters $HP_1$ to $HP_n$, and other independent variable(s).

Figure 7:
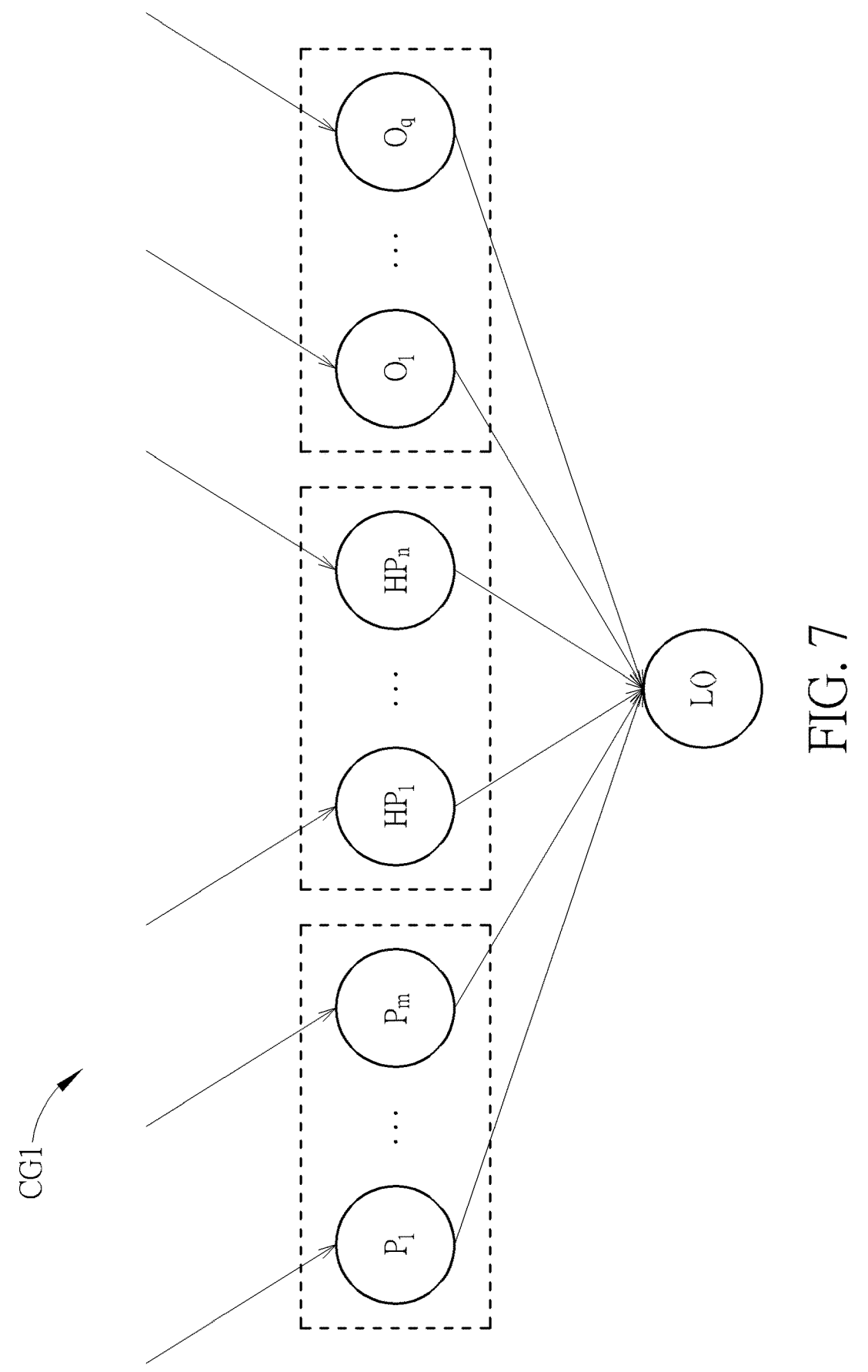
FIG. 7 is a schematic diagram of part of a causal graph according to an embodiment of the present invention.

Specifically, the present invention may find the causal relationship between the loss function L( ), the parameters $P_1$ to $P_m$, the hyperparameters $HP_1$ to $HP_n$, and/or other independent variable(s) (e.g., a causal graph of the loss function L( ), the parameters $P_1$ to $P_m$, the hyperparameters $HP_1$ to $HP_n$, and/or other independent variable(s)). Therefore, the loss function L( ), the parameters $P_1$ to $P_m$, the hyperparameters $HP_1$ to $HP_n$, and other independent variable(s) may be regarded as causal variables. For example, FIG. 7 is a schematic diagram of part of a causal graph CG1 according to an embodiment of the present invention. The loss function L( ), the parameters $P_1$ to $P_m$, the hyperparameters $HP_1$ to $HP_n$ serving as causal variables constitute the causal graph CG1 used by a causal model, where q is a positive integer. As shown in FIG. 7, the causal dimensionality found by Causal Bayesian Optimization may be m+n+q, so there are m+n+q independent variables that are fed into the loss function L( ) of Causal Bayesian Optimization for optimization. Accordingly, the values of m+n+q causal variables that are able to minimize the loss function L(are calculated. The causal graph CG1 may significantly improve the ability to reason about optimal decision making strategies, thereby decreasing optimization cost and avoiding suboptimal solutions.

In one embodiment, a causal model for optimization may be selected based on maximum a posterior (MAP) and point estimation to obtain/derive a causal graph of a loss function, parameter(s), hyperparameter(s), and other independent variable(s). Accordingly, causal variables of a causal graph of the causal model (e.g., the number of the causal variables, which attributes a causal variable has, or the number of the attributes of a causal variable) and a causal structure of the causal graph (e.g., how attributes connect to each other) are determined/found/created together (at a time or in one go). Deciding the causal variables and the causal structure simultaneously/parallelly may avoid problems incurred by deciding first causal variables and then a causal structure.

Figure 8:
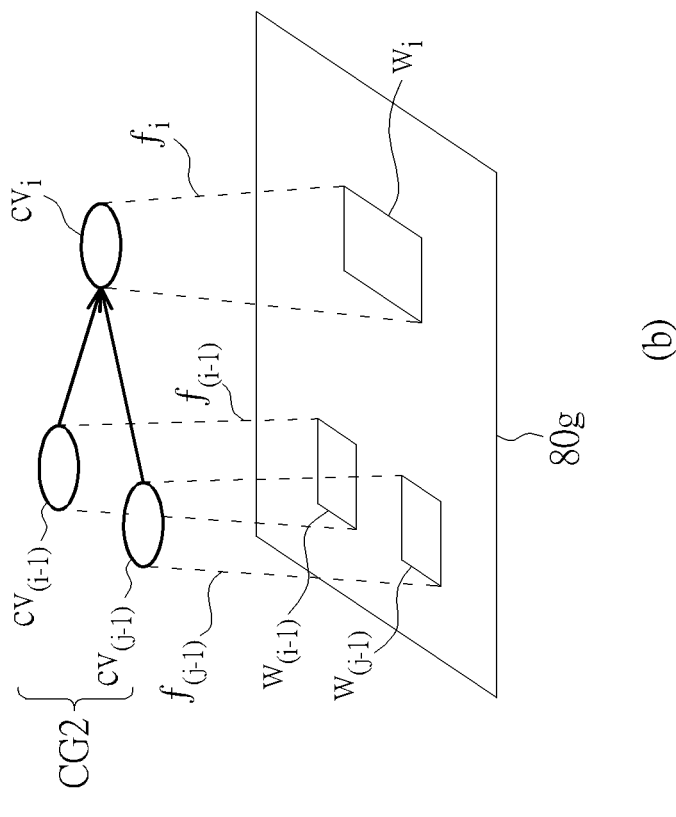
FIG. 8 is a schematic diagram of grounding data and part of a causal graph according to an embodiment of the present invention.
Figure 8:
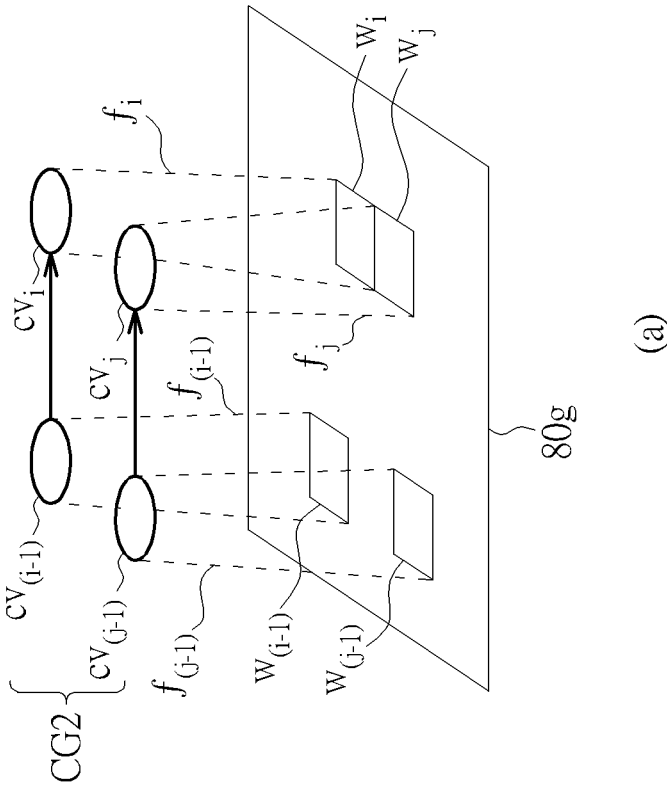

For example, FIG. 8 is a schematic diagram of grounding data 80g and part of a causal graph CG2 according to an embodiment of the present invention. In FIG. 8, (a) and (b)

respectively illustrate two possibilities of the grounding data 80g and the causal graph CG2. The causal graph CG2 may serve as the causal graph CG1. In one embodiment, the grounding data 80g may be obtained or derived from the space of all observable samples, and thus may be referred to as observation data. In one embodiment, the grounding data 80g may correspond to all deep learning models. In one embodiment, the grounding data 80g may be obtained or derived from all the data having been collected. In one embodiment, the grounding data 80g may include or be related to all signals transmitted (e.g., label(s), the outputs $\hat{y}(t)$ to $\hat{y}(t-k)$ of the model, the input signals $x(t)$ to $x(t-k)$, the pre-distortion output signals $z(t)$ to $z(t-k)$, or the output signals $y(t)$ to $y(t-k)$) at any time in any manner.

In FIG. 8, a causal structure of the causal graph CG2 may present the relationship between causal variables (e.g., causal variables $cv_{(i-1)}$, $cv_i$, $cv_{(j-1)}$, and $cv_j$). Observation functions $f_{(i-1)}$, $f_i$, $f_{(j-1)}$, and $f_j$ may be used to map subdata $w_{(i-1)}$, $w_i$, $w_{(j-1)}$, and $w_j$ of the grounding data 80g to the causal variables $cv_{(i-1)}$, $cv_i$, $c_{(j-1)}$, and $cv_j$ so as to show the relationship between the causal variables $cv_{(i-1)}$, $cv_i$, $cv_{(j-1)}$, and $cv_j$ and the subdata $w_{(i-1)}$, $w_i$, $w_{(j-1)}$, and $w_j$ of the grounding data 80g. Here, i, j are positive integers. The mapping here is on a basis of the corresponding subdata (e.g., $w_{(i-1)}$, $w_i$, $w_{(j-1)}$, and $w_j$) (e.g., framed area(s) in FIG. 8) instead of the (whole) grounding data 80g. For example, if the causal variable $cv_{(i-1)}$ corresponds to the parameter $P_1$, the subdata $w_{(i-1)}$ is related to attributes of the causal variable $cv_{(i-1)}$ (for example, the subdata $w_{(i-1)}$ is related to all data about the parameter $P_1$).

In one embodiment, a posterior probability $P(f_i, C|w_i)$ of assigning the subdata $w_i$ of the grounding data 80g to the observation function $f_i$ and a causal structure C of the causal graph CG may be maximized so as to determine/derive the corresponding causal structure C and the corresponding causal variable $cv_i$ based on the subdata $w_i$ of the grounding data 80g. Accordingly, inference of the causal model may be described by combining Bayesian network (e.g., for the causal structure) with the observation functions (e.g., $f_{(i-1)}$, $f_i$, $f_{(j-1)}$, and $f$). It is noteworthy that causal variables (e.g., $cv_{(i-1)}$, $cv_i$, $cv_{(j-1)}$, and $cv_j$) and the corresponding causal structure (e.g., C) of the corresponding causal graph (e.g., CG) are obtained/determined together (namely, the causal variables (e.g., $cv_{(i-1)}$, $cv_i$, $cv_{(j-1)}$, and $cv_j$) are learned along/together with the causal structure (e.g., C)), so the causal variables (e.g., $cv_{(i-1)}$, $cv_i$, $cv_{(j-1)}$, and $cv_j$) and the causal structure (e.g., C) may interact/affect/constrain each other.

In one embodiment, the posterior probability $P(f_i,C|w_i,$ Int) may satisfy $P(f_i,C|w_i,$ Int$) \propto P(f_i, C)\ P(w_i|f_i,C,$ Int$)$ according to the Bayesian rule, where f may denote the corresponding observation function, C may denote the corresponding causal structure, $w_i$ may denote part of the grounding data 80g (e.g., subdata), and Int may denote intervention. In one embodiment, the posterior probability $P(f_i,C|w_i)$ may be proportional to $P(f_i,C)\ P(w_i|f_i,C)$ or $$\prod\nolimits_{t=0}^{T}P(w_{i,t}\,|\,s_{t-1},\,C,\,f_i)^{(T-t)^{-\gamma}},$$

where $s_{t-1}$ may denote the state at a time instant $t-1$, T may denote a current/present time instant, and $\gamma$ may be 0.5, but is not limited thereto. In one embodiment, $P(w|f_i,C)$ may be $$\prod\nolimits_{t=0}^{T}P(w_{i,t}\,|\,s_{t-1},\,C,\,f_i).$$

In one embodiment, $P(w_{i,t}|s_{t-1},\ C,\ f_i)$ may be $$\frac{1}{|R_{s_t}|}\prod\prod\nolimits_{i=1}^{Ncv}P(s_{i,t}\,|\,s_{t-1},\,C)$$

or $$\sum\nolimits_{s_t}P(w_{i,t}\,|\,s_t,\,f_i)\prod\nolimits_{i=1}^{Ncv}P(s_{i,t}\,|\,s_{t-1},\,C),$$

where $s_{i,t}$ may denote the state of the causal variable $cv_i$ at a time instant t, Ncv may denote the total number of all causal variables (e.g., including the causal variables $cv_{(i-1)}$, $cv_i$, $c_{(j-1)}$, and $cv_j$), Ncv is a positive integer, and $R_{s_t}$ may denote the data amount of the subdata $w_i$ which is compatible with the state $s_i$ of the causal variable $cv_i$ within the grounding data 80g. In one embodiment, the present invention may select/find the causal variable $cv_i$ that minimizes the data amount $R_{s_i}$ such that data within the grounding data 80g which are frequently used (e.g., the subdata $w_i$) may be cut into finer pieces than those which are rarely used.

As set forth above, Bayesian probability mechanism may combine the number of causal variables (e.g., including the causal variables $cv_{(i-1)}$, $cv_i$, $cv_{(j-1)}$, and $cv_j$), states of the causal variables, a causal structure of the causal variables, or observation functions for the causal variables (e.g., including the observation functions $f_{(i-1)}$, $f_i$, $f_{(j-1)}$, and $f_j$) and draw relevant joint inferences to explain/interpret the grounding data 80g, thereby creating the causal graph CG2. The causal variables (e.g., including the causal variables $cv_{(i-1)}$, $cv_i$, $cv_{(j-1)}$, and $cv_j$) of the causal graph CG2 (or the number of the causal variables) and the causal structure (e.g., C) are determined at the same time, thereby differentiating (a) from (b) of FIG. 8, and vice versa.

As shown in FIG. 8, each causal variable (e.g., $cv_i$) may correspond to an observation function (e.g., $f_i$). In one embodiment, an observation function (e.g., $f_i$) may be calculated/derived using a causal semantic generative (CSG) model so as to predict low-dimensional state attributes (e.g., attribute(s) of the state of the causal variable $cv_i$) from high-dimensional environmental variables (e.g., the grounding data 80g). When causal variables (e.g., $cv_{(i-1)}$, $cv_i$, $cv_{(j-1)}$, and $cv_j$) are manually defined (e.g., causal variables are defined (nonautomatically and individually) by domain expert(s) or defined automatically by using a program with rules described/provided by domain expert(s)), each causal variable (e.g., $cv_i$) may have a dedicated causal semantic generative observation function to ground the causal variable onto the corresponding subdata (e.g., the $w_i$) (e.g., a framed area in FIG. 8). This means that subdata (e.g., the subdata $w_{(i-1)}$, $w_i$, $w_{(j-1)}$, and $w_j$ corresponding to the framed areas in FIG. 8) is determined based on the definition(s) of particular causal variable(s) from domain expert(s). Moreover, the causal semantic generative model may avoid deeming variation factor(s) cause(s) of a causal variable (e.g., $cv_i$), and may correctly determine semantic factor(s) to be the cause(s) of the causal variable (e.g., $cv_i$). In one embodiment, variation factor(s) and semantic factor(s) may constitute/belong to observation data. In one embodiment, the causal semantic generative model is primarily based on causal invariance principle and involves variational Bayes.

In one embodiment, the observation function $f_i$ may satisfy $s_{i,t}=f_i(w_{i,t})$. In one embodiment, the observation function $f_i$ may be implemented using multivariate Gaussian distribution: For example, the observation function $f_i$ may satisfy $$f_i(w_i, z) = N\left(\begin{pmatrix} w_i \\ z \end{pmatrix} \middle| \begin{pmatrix} \mu_{w_i} \\ \mu_z \end{pmatrix}, \Sigma\right).$$

Alternatively, the observation function $f_i$ may be related to $$N\left(\begin{pmatrix} w_i \\ z \end{pmatrix} \middle| \begin{pmatrix} \mu_{w_i} \\ \mu_z \end{pmatrix}, \Sigma\right),$$

where z may denote subdata (which does not contribute to the causal variable $cv_i$) within the grounding data 80g, $\mu_{w_i}$, $\mu_v$ may denote means fixed as zero vectors, $\Sigma$ may be parameterized by Cholesky decomposition to satisfy, for example, $\Sigma = LL^T$. The matrix L may be a lower-triangular matrix with positive diagonals and may, for example, be parameterized to satisfy $$L = \begin{pmatrix} L_{w_i w_i} & 0 \\ M_{zw_i} & L_{zz} \end{pmatrix}.$$

Each of the matrixes $L_{w_i w_i}$, $L_{zz}$ may be smaller lower triangular matrixes. The matrix $M_{zw_i}$ may be any arbitrary matrix. Each of the matrixes $L_{w_i w_i}$, $L_{zz}$ may be parameterized by a summation of positive diagonal elements (guaranteed via an exponential map) and a lower triangular matrix (without positive diagonal elements).

Figure 9:
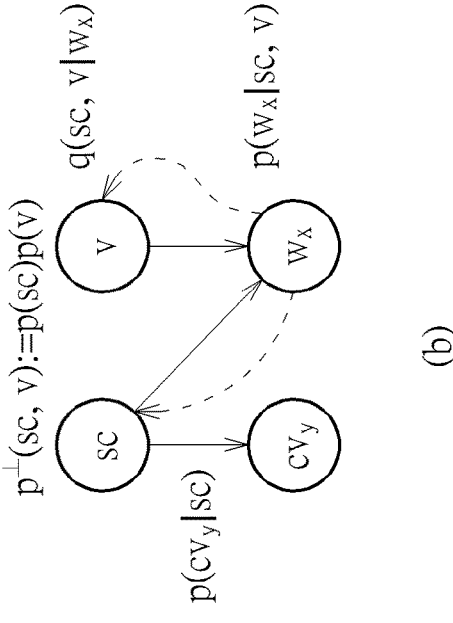
FIG. 9 is a schematic diagram of a causal variable and subdata according to an embodiment of the present invention.
Figure 9:
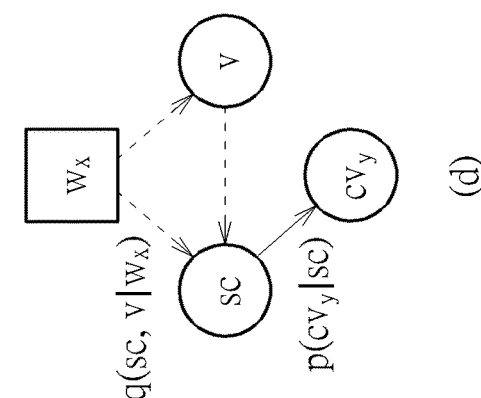
Figure 9:
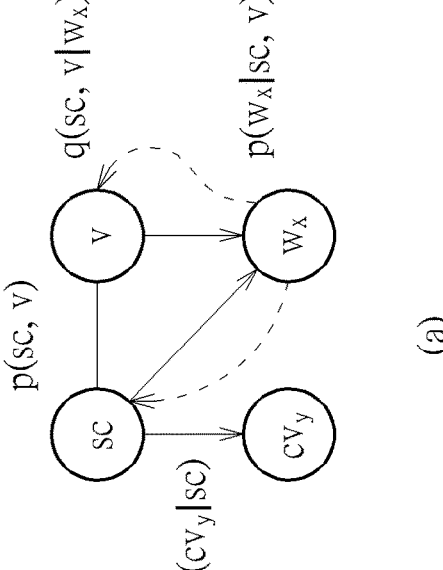
Figure 9:
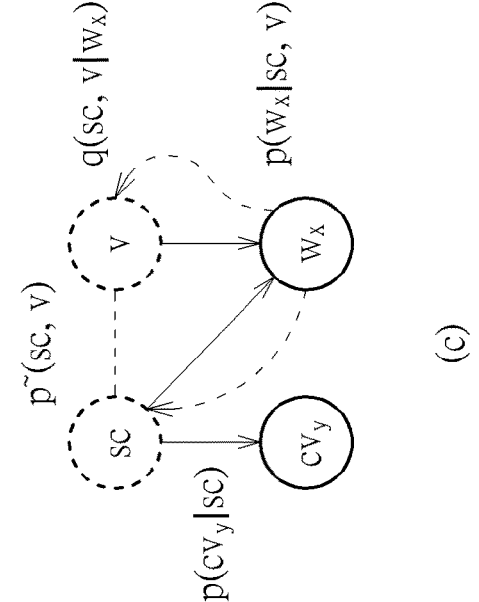

In one embodiment, the relationship between causal variables (e.g., $cv_i$) and subdata (e.g., $w_i$) may be unknown, but the causal variables may be predicted/inferred from the subdata using a causal semantic generative model. For example, FIG. 9 is a schematic diagram of a causal variable $cv_y$ and subdata $w_x$ according to an embodiment of the present invention, where (a), (b), (c), and (d) respectively illustrate structure possibilities of the causal semantic generative model, sc may represent a semantic factor, v may represent a variation factor, solid arrows may represent causal mechanisms $p(w_x|sc, v)$ and $p(cv_y|sc)$, dashed arrows may represent inference models $q(sc, v|w_x)$ for learning. In (a) of FIG. 9, a solid undirected line between the semantic factor sc and the variation factor v may represent a domain-specific prior $p(sc, v)$. Compared with the solid undirected line between the semantic factor sc and the variation factor v in (a) of FIG. 9, (b) of FIG. 9 introduces an independent prior $p^\perp(sc, v) := p(sc)p(v)$ to reflect intervention so as to improve out-of-distribution generalization performance. Compared with the solid undirected line between the semantic factor sc and the variation factor v in (a) of FIG. 9, (c) of FIG. 9 introduces a prior $p^-(sc, v)$ presented by a dotted line between the semantic factor sc and the variation factor v to reflect intervention according to causal invariance principle so as to leverage unsupervised data. In one embodiment, the present invention may fit the causal semantic generative model $p := <p(sc, v), p(w_x|sc, v), p(cv_y|sc)>$ to subdata by maximizing likelihood, perform calculation using variational inference and evidence lower bound (ELBO), and use Monte Carlo to estimate expectations after applying reparameterization tricks.

In one embodiment, Causal Bayesian Optimization may perform optimization only for causal variables directly related to the loss function (e.g., the parameters $P_1$ to $P_m$, the hyperparameters $HP_1$ to $HP_n$, and independent variables $O_1$ to $O_q$ in causal graph CG1, which directly point to or affect the loss function L( )). In other words, the causal intrinsic dimensionality of Causal Bayesian Optimization is given by the number of the parameters $P_1$ to $P_m$, the hyperparameters $HP_1$ to $HP_n$, and independent variables $O_1$ to $O_q$, which are causes/parents of the loss function L( ), rather than the number of causal variables which are causes of the parameters $P_1$ to $P_m$, the hyperparameters $HP_1$ to $HP_n$, and independent variables $O_1$ to $O_q$, thereby improving the ability to reason about optimal decision making strategies.

In one embodiment, causal variables (e.g., the parameters $P_1$ to $P_m$, the hyperparameters $HP_1$ to $HP_n$, the independent variables $O_1$ to $O_q$, which serve as causal variables, or the causal variables $cv_{(i-1)}$, $cv_i$, $cv_{(j-1)}$, $cv_j$) are manually defined (e.g., by domain expert(s)). For example, causal variables are defined by domain experts (nonautomatically and individually); alternatively, causal variables are defined automatically using a program with rules described by domain experts. In one embodiment, subdata (e.g., the subdata $w_{(i-1)}$, $w_i$, $w_{(j-1)}$, and $w_j$ corresponding to the framed areas in FIG. 8) are defined/determined according to the definition of specific causal variables by domain experts.

Causal Bayesian Optimization treats causal variables being output (e.g., the loss function LO) and causal variables being input (e.g., the parameters $P_1$ to $P_m$, the hyperparameters $HP_1$ to $HP_n$, or the independent variables $O_1$ to $O_q$) as invariant independent variables, and disregards the existence of a temporal evolution in both the causal variables being output and the causal variables being input (i.e., whether the causal variables being output and the causal variables being input change over time), and thus breaks the time dependency structure existing among causal variables. While disregarding time may significantly simplify the problem, it prevents the identification of an optimal intervention at every time instant, and (especially in a non-stationary scenario) may lead to a sub-optimal solution instead of providing the current optimal solution at any time instant. Thus, the present invention may extend to Dynamic Causal Bayesian Optimization, which offer/account for the causal relationship between causal variables and the causal relationship may evolve/change over time, and thus facilitates in scenarios where all causal effects in a causal graph vary over time.

Figure 10:
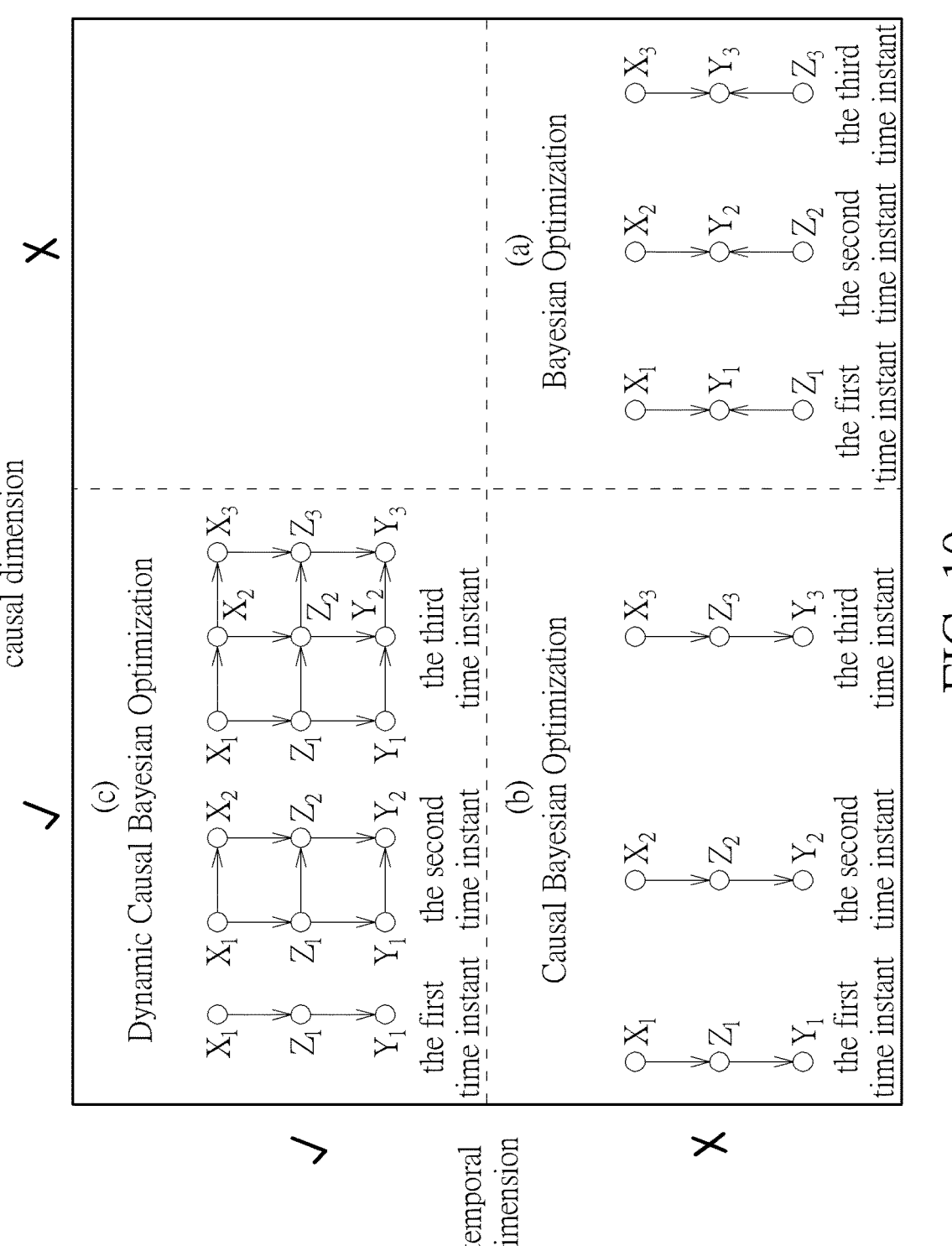
FIG. 10 is a schematic diagram of Bayesian Optimization, Causal Bayesian Optimization, and Dynamic Causal Bayesian Optimization.

For example, FIG. 10 is a schematic diagram of Bayesian Optimization, Causal Bayesian Optimization, and Dynamic Causal Bayesian Optimization. In FIG. 10, $X_1$ to $X_3$ represent a causal variable at three different time instants. $Y_1$ to $Y_3$ represent another causal variable at three different time instants. $Z_1$ to $Z_3$ represent the other causal variable at three different time instants. However, the present invention is not limited thereto and may extend to more time instants or more causal variables. Dynamic Causal Bayesian Optimization combines Bayesian Optimization and Causal Bayesian Optimization to account for the causal relationships among causal variables, and the causal relationship may evolve over time. For example, in Dynamic Causal Bayesian Optimization, as shown in FIG. 10, the causal variable $Y_1$ at the first time instant is a function of the causal variable $Z_1$ at the first time instant; therefore, the extremum value of the causal variable $Y_1$ (which may represent or correspond to the loss function L( )) may be found by using only the causal variable $Z_1$, which is directly related to the causal variable $Y_1$, and the causal intrinsic dimensionality is 1. Similarly, the causal variable $Y_2$ at the second time instant is a function of the causal variable $Z_2$ at the second time instant and the causal variable $Y_1$ at the first time instant; therefore, the extremum value of the causal variable $Y_2$ (which may represent or correspond to the loss function $L(\ )$) may be found by using only the causal variable $Y_1$ and $Z_2$, which are directly related to the causal variable $Y_2$, and the causal intrinsic dimensionality is 2. Similarly, the causal variable $Y_3$ at the third time instant is a function of the causal variable $Z_3$ at the third time instant and the causal variable $Y_2$ at the second time instant; therefore, the extremum value of the causal variable $Y_3$ (which may represent or correspond to the loss function $L(\ )$) may be found by using only the causal variable $Y_2$ and $Z_3$, which are directly related to the causal variable $Y_3$, and the causal intrinsic dimensionality is 2. In other words, a causal variable serving as a dependent variable at a time instant is a function of causal variable(s) at previous time instant(s) (serving either as dependent or independent variable(s)), and therefore the extremum value of the former (i.e., a causal variable serving as a dependent variable at a certain time instant) may be found by using only the latter directly related to the former (i.e., causal variable(s) serving either as dependent or independent variable(s) at previous time instant(s)).

A pre-compensation method in the embodiment of the present invention is available to the amplification circuits 10 to 30 or the recurrent DPD-PA cascade model 40, and may be compiled into a code, which may be executed by a processing circuit and stored in a storage circuit. The steps of the pre-compensation may include the following steps:

Step S10: Start.

Step S12: The DPD actuator 321 (or 221) performs pre-distortion according to at least one parameter or at least one hyperparameter so as to convert the input signal x(t) received by the DPD actuator 321 into the pre-distortion output signal z(t).

Step S14: The training module 322 (or 222) determines, calculates, or updates the at least one parameter or the at least one hyperparameter of the DPD actuator 321 according to Bayesian Optimization, Causal Bayesian Optimization, or Dynamic Causal Bayesian Optimization. The training module 322 may apply Bayesian Optimization, Causal Bayesian Optimization, or Dynamic Causal Bayesian Optimization to at least one data so as to determine the at least one parameter or the at least one hyperparameter. The at least one data may be extracted/obtained from the pre-distortion output signal z(t) (which is output by the DPD actuator 321 in response to the input signal x(t)) or the output signal y(t) (which is output by the PA 350 (or 250) in response to the pre-distortion output signal z(t)). Alternatively, the at least one data may be extracted/obtained from the input signals x(t−1), . . . , or x(t−k) (which are received by the DPD actuator 321 before the input signal x(t)), the pre-distortion output signal z(t−1), . . . , or z(t−k) (which are output by the DPD actuator 321 before the pre-distortion output signal z(t) in response to the input signals x(t−1), . . . , or x(t−k)), or the output signal y(t−1), . . . , or y(t−k) (which are output by the PA 350 before the output signal y(t) in response to the pre-distortion output signal z(t−1), . . . , or z(t−k)). Alternatively, the at least one data may be extracted/obtained from a label corresponding to the input signal x(t) or the output signal y(t).

Step S16: The DPD actuator 321 performs pre-distortion according to the at least one parameter updated or the at least one hyperparameter updated so as to convert the input signal x(t+1) received by the DPD actuator 321 into the pre-distortion output signal z(t+1).

Step S18: End.

In one embodiment, the storage circuit is configured to store image data or instructions. The storage circuit may be a read-only memory (ROM), a flash memory, a random access memory (RAM), a hard disk, a non-volatile storage device, a non-transitory computer-readable medium, but is not limited thereto. In one embodiment, the processing circuit is configured to execute instructions (stored in the storage circuit). The processing circuit may be a microprocessor, or an application-specific integrated circuit (ASIC), but is not limited thereto. The amplification circuit 10, 20, or 30 may be utilized in a radio unit (RU), but is not limited thereto.

In summary, the present invention proposes a recurrent DPD-PA cascade model trained by Dynamic Causal Bayesian Optimization. (DPD is actually a "copy of PA[1]".) This way, computational complexity and calculation can be greatly reduced. The DPD may be updated by the copy of $PA^{-1}$ in real time as opposed to at intervals, which may effectively compensate for deficiencies of a power amplifier like nonlinearity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pre-compensation method, for a pre-compensation circuit coupled to a power amplifier, comprising:

performing pre-distortion according to at least one parameter or at least one hyperparameter to convert a first input signal received by the pre-compensation circuit into a first pre-distortion output signal;

updating the at least one parameter or the at least one hyperparameter according to Causal Bayesian Optimization or Dynamic Causal Bayesian Optimization; and performing pre-distortion according to the at least one parameter updated or the at least one hyperparameter updated to convert a second input signal received by the pre-compensation circuit into a second pre-distortion output signal;

wherein a plurality of independent variable optimal values are found together from a plurality of independent variables according to the Causal Bayesian Optimization or the Dynamic Causal Bayesian Optimization;

wherein the plurality of independent variable optimal values comprises the at least one parameter or the at least one hyperparameter;

wherein a causal structure of a causal graph and a plurality of causal variables of the causal graph are determined together;

wherein the plurality of causal variables comprise a loss function and the plurality of independent variables;

wherein the loss function is a function of an output signal output by the power amplifier corresponding to the first pre-distortion output signal or a label corresponding to the output signal;

wherein a plurality of posterior probabilities of assigning a plurality of subdata of grounding data to a plurality of observation functions and the causal structure of the causal graph are maximized to generate the causal graph;

wherein one of the plurality of posterior probabilities is proportional to $$\prod\nolimits_{t=0}^{T} P(w_{i,t} \mid s_{t-1}, C, f_i)^{(T-t)^{-\gamma}},$$

where $w_{i,t}$ denotes one of the plurality of subdata, which is corresponding to one of the plurality of causal variables, at a time instant t, $S_{t-1}$ denotes at least one state at a time instant t−1, C denotes the causal structure, $f_i$ denotes a corresponding one of the observation functions, T denotes a current time instant, and $\gamma$ is a real number.

2. The pre-compensation method of claim 1, wherein the step of updating the at least one parameter or the at least one hyperparameter according to the Causal Bayesian Optimization or the Dynamic Causal Bayesian Optimization comprises:

applying the Causal Bayesian Optimization or the Dynamic Causal Bayesian Optimization to at least one data to determine the at least one parameter or the at least one hyperparameter of the pre-compensation circuit, wherein the at least one data is extracted from the first pre-distortion output signal or the output signal output by the power amplifier corresponding to the first pre-distortion output signal.

3. The pre-compensation method of claim 2, wherein the at least one data is further extracted from at least one previous input signal received by the pre-compensation circuit before the first input signal, at least one previous pre-distortion output signal output corresponding to the at least one previous input signal by the pre-compensation circuit before the first pre-distortion output signal, or at least one previous output signal output corresponding to the at least one previous pre-distortion output signal by the power amplifier, or the label corresponding to the output signal.

4. The pre-compensation method of claim 1, wherein the step of updating the at least one parameter or the at least one hyperparameter according to the Causal Bayesian Optimization or the Dynamic Causal Bayesian Optimization comprises:

determining the plurality of independent variable optimal values together according to the Causal Bayesian Optimization or the Dynamic Causal Bayesian Optimization, and the plurality of independent variable optimal values comprises the at least one parameter, the at least one hyperparameter, and at least one first independent variable optimal value.

5. The pre-compensation method of claim 1, wherein the step of updating the at least one parameter or the at least one hyperparameter according to the Causal Bayesian Optimization Optimization, or the Dynamic Causal Bayesian Optimization comprises:

searching for the plurality of independent variable optimal values together from the plurality of independent variables according to the Causal Bayesian Optimization or the Dynamic Causal Bayesian Optimization.

6. The pre-compensation method of claim 5, wherein the causal graph is generated based on maximum a posteriori and point estimation.

7. The pre-compensation method of claim 5, wherein the plurality of subdata in the grounding data is mapped to the plurality of causal variables of the causal graph by using the plurality of observation functions, to generate the causal graph from the grounding data based on maximum a posteriori and point estimation.

8. The pre-compensation method of claim 7, wherein the plurality of observation functions are obtained based on a causal semantic generative model.

9. The pre-compensation method of claim 7, wherein the step of updating the at least one parameter or the at least one hyperparameter according to the Causal Bayesian Optimization or the Dynamic Causal Bayesian Optimization comprises:

applying the Causal Bayesian Optimization or the Dynamic Causal Bayesian Optimization to at least one data to determine the at least one parameter or the at least one hyperparameter of the pre-compensation circuit, wherein the grounding data comprises the at least one data.

10. The pre-compensation method of claim 1, wherein the step of updating the at least one parameter or the at least one hyperparameter according to the Causal Bayesian Optimization or the Dynamic Causal Bayesian Optimization comprises:

searching for the plurality of independent variable optimal values according to the Dynamic Causal Bayesian Optimization, wherein a second loss function at a second time instant is a function of the plurality of independent variables at the second time instant, the plurality of independent variables at a first time instant, or a first loss function at the first time instant.

11. A pre-compensation circuit, coupled to a power amplifier, comprising:

a digital pre-distortion actuator, configured for performing pre-distortion according to at least one parameter or at least one hyperparameter to convert a first input signal received by the digital pre-distortion actuator into a first pre-distortion output signal; and a training module, configured for updating the at least one parameter or the at least one hyperparameter according to Causal Bayesian Optimization or Dynamic Causal Bayesian Optimization, wherein the digital pre-distortion actuator performs pre-distortion according to the at least one parameter updated or the at least one hyperparameter updated to convert a second input signal received by the digital pre-distortion actuator into a second pre-distortion output signal;

wherein a plurality of independent variable optimal values are found together from a plurality of independent variables according to the Causal Bayesian Optimization or the Dynamic Causal Bayesian Optimization;

wherein the plurality of independent variable optimal values comprises the at least one parameter or the at least one hyperparameter;

wherein a causal structure of a causal graph and a plurality of causal variables of the causal graph are determined together;

wherein the plurality of causal variables comprise a loss function and the plurality of independent variables;

wherein the loss function is a function of an output signal output by the power amplifier corresponding to the first pre-distortion output signal or a label corresponding to the output signal;

wherein a plurality of posterior probabilities of assigning a plurality of subdata of grounding data to a plurality of observation functions and the causal structure of the causal graph are maximized to generate the causal graph;

wherein one of the plurality of posterior probabilities is proportional to $$\prod\nolimits_{t=0}^{T} P(w_{i,t} \mid s_{t-1}, C, f_i)^{(T-t)^{-\gamma}},$$

where $W_{i,t}$ denotes one of the plurality of subdata, which is corresponding to one of the plurality of causal variables, at a time instant t, $S_{t-1}$ denotes at least one state at a time instant t−1, C denotes the causal structure, $f_i$ denotes a corresponding one of the observation functions, T denotes a current time instant, and $\gamma$ is a real number.

12. The pre-compensation circuit of claim 11, wherein the Causal Bayesian Optimization or the Dynamic Causal Bayesian Optimization is applied to at least one data to determine the at least one parameter or the at least one hyperparameter of the digital pre-distortion actuator, wherein the at least one data is extracted from the first pre-distortion output signal or the output signal output by the power amplifier corresponding to the first pre-distortion output signal.

13. The pre-compensation circuit of claim 12, wherein the at least one data is further extracted from at least one previous input signal received by the digital pre-distortion actuator before the first input signal, at least one previous pre-distortion output signal output corresponding to the at least one previous input signal by the digital pre-distortion actuator before the first pre-distortion output signal, or at least one previous output signal output corresponding to the at least one previous pre-distortion output signal by the power amplifier, or the label corresponding to the output signal.

14. The pre-compensation circuit of claim 11, wherein the plurality of independent variable optimal values comprises the at least one parameter, the at least one hyperparameter, and at least one first independent variable optimal value.

15. The pre-compensation circuit of claim 11, wherein the causal graph is generated based on maximum a posteriori and point estimation.

16. The pre-compensation circuit of claim 11, wherein the plurality of subdata in the grounding data is mapped to the plurality of causal variables of the causal graph by using the plurality of observation functions, to generate the causal graph from the grounding data based on maximum a posteriori and point estimation.

17. The pre-compensation circuit of claim 16, wherein the plurality of observation functions are obtained based on a causal semantic generative model.

18. The pre-compensation circuit of claim 16, wherein the Causal Bayesian Optimization or the Dynamic Causal Bayesian Optimization is applied to at least one data to determine the at least one parameter or the at least one hyperparameter of the digital pre-distortion actuator, wherein the grounding data comprises the at least one data.

19. The pre-compensation circuit of claim 11, wherein the plurality of independent variable optimal values are found according to the Dynamic Causal Bayesian Optimization, wherein a second loss function at a second time instant is a function of the plurality of independent variables at the second time instant, the plurality of independent variables at a first time instant, or a first loss function at the first time instant.

\* \* \* \* \*